United States Patent [19]
Bryan et al.

[11] Patent Number: 5,389,797
[45] Date of Patent: Feb. 14, 1995

[54] PHOTODETECTOR WITH ABSORBING REGION HAVING RESONANT PERIODIC ABSORPTION BETWEEN REFLECTORS

[75] Inventors: Robert P. Bryan; Gregory R. Olbright, both of Boulder, Colo.; Thomas M. Brennan; Jeffrey Y. Tsao, both of Albuquerque, N. Mex.

[73] Assignee: The United States of America as represented by the Secretary of the Department of Energy, Washington, D.C.

[21] Appl. No.: 943,823

[22] Filed: Feb. 24, 1993

[51] Int. Cl.$^6$ ............... H01L 31/04; H01L 29/205
[52] U.S. Cl. ................................. 257/21; 257/186; 257/187; 257/436
[58] Field of Search ............... 257/21, 186, 187, 436

[56] References Cited

U.S. PATENT DOCUMENTS

| | | | |
|---|---|---|---|
| 4,943,970 | 7/1990 | Bradley | 257/21 |
| 4,949,350 | 8/1990 | Jewell et al. | 257/21 |
| 5,229,627 | 7/1993 | Kosaka | 257/436 |

FOREIGN PATENT DOCUMENTS 3109779  5/1991  Japan ................................. 257/186

OTHER PUBLICATIONS

M. S. Unlu et al., "Resonant Cavity Enhanced AlGaAs/GaAs Heterojunction Phototransistors with an Intermediate InGaAs Layer in the Collector," *Appl. Phys. Lett.*, vol. 57, No. 8, Aug. 20, 1990, pp. 750–752.
M. Y. A. Raja et al., "Surface-Emitting, Multiple Quantum Well GaAs/AlGaAs Laser with Wavelength-Resonant Periodic Gain Medium," *Appl. Phys. Lett.*, vol. 53, No. 18, Oct. 31, 1988, pp. 1679–1680.

*Primary Examiner*—Jerome Jackson
*Attorney, Agent, or Firm*—Karuna Ojanen; James H. Chafin; William R. Moser

[57] ABSTRACT

A photodetector that is responsive to a wavelength or wavelengths of interest which have heretofore been unrealized. The photodetector includes a resonant cavity structure bounded by first and second reflectors, the resonant cavity structure being resonant at the wavelength or wavelengths of interest for containing a plurality of standing waves therein. The photodetector further includes a radiation absorbing region disposed within the resonant cavity structure, the radiation absorbing region including a plurality of radiation absorbing layers spaced apart from one another by a distance substantially equal to a distance between antinodes of adjacent ones of the standing waves. Each of radiation absorbing layers is spatially positioned at a location of one of the antinodes of one of the standing waves such that radiation absorption is enhanced. The radiation absorbing layers may be either bulk layers or quantum wells includes a plurality of layers, each of which is comprised of a strained layer of InGaAs. Individual ones of the InGaAs layers are spaced apart from one another by a GaAs barrier layer.

29 Claims, 7 Drawing Sheets

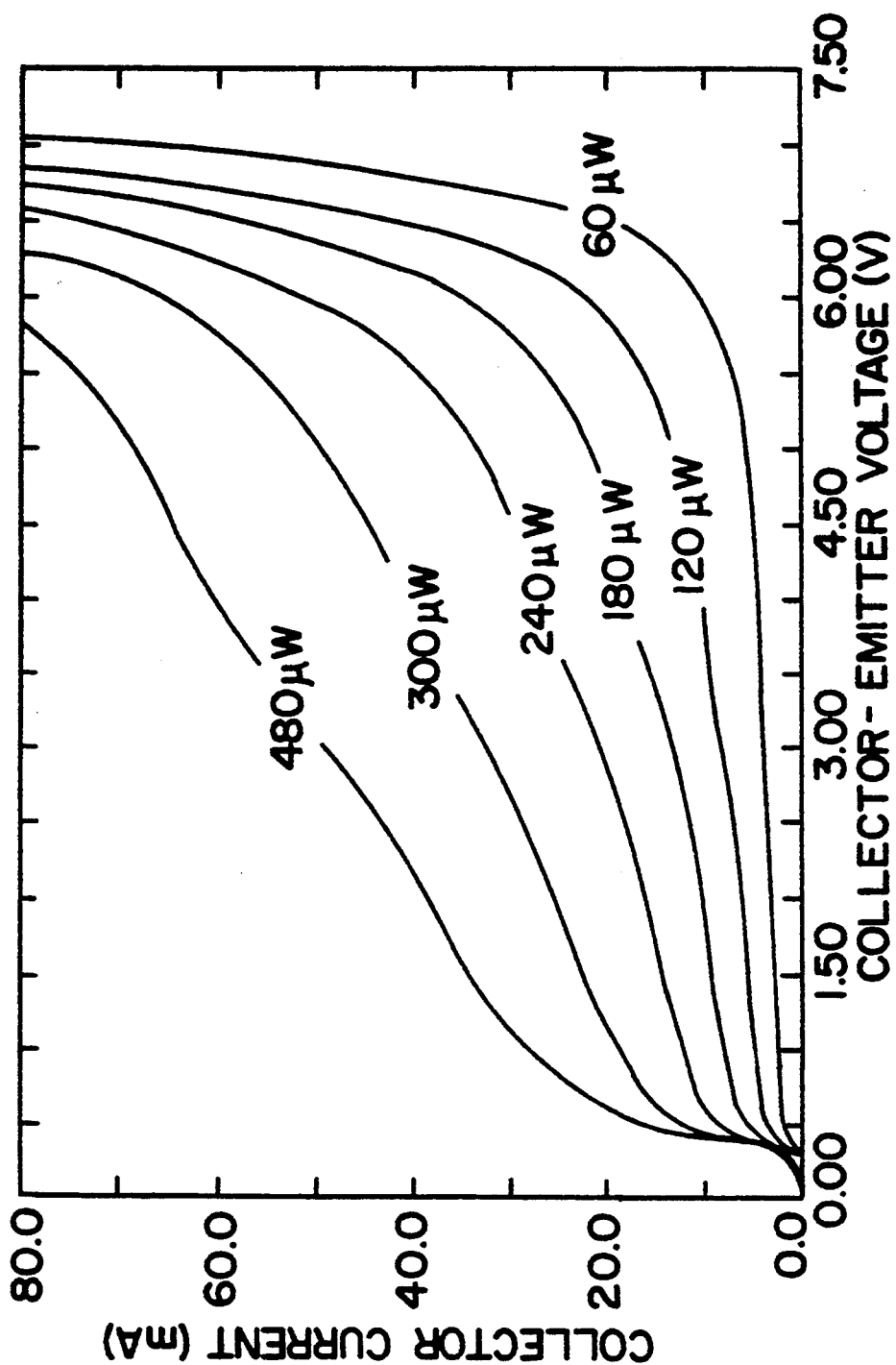

PHOTODETECTOR WITH ABSORBING REGION HAVING RESONANT PERIODIC ABSORPTION BETWEEN REFLECTORS

The Government has rights in this invention pursuant to Contract No. DE-AC04-75P00789 between the U.S. Department of Energy and American Telephone and Telegraph Company.

FIELD OF THE INVENTION

This invention relates generally to optoelectronic devices and, particularly, to a photodetector having a semiconductor resonant cavity having resonant periodic absorption, between two reflectors, preferably distributed Bragg reflectors, resulting in enhanced sensitivity to certain wavelengths of interest.

BACKGROUND OF THE INVENTION

A problem exists in obtaining a high-gain semiconductor-based photodetector that operates at specific wavelengths of interest. And in particular, one embodiment of the invention is a high-gain semiconductor heterojunction phototransistor (HPT), of a type based on Group III-V material, responsive to wavelengths in the range of approximately 930 nanometers (nm) to approximately one micrometer; this embodiment has not been heretofore practicably achieved because of a lack of sufficient absorption of the incident radiation.

One method to increase photosensitivity at wavelengths greater than 900 nm is to incorporate InGaAs material into the device. However, because of crystal lattice mismatch between GaAs and InGaAs, the thickness and composition of the InGaAs layers are constrained. This limits the thickness of the InGaAs layer to a thickness that is significantly less than an optical absorption length. As a result, the inclusion of a relatively thin InGaAs layer results in a device with a relatively low gain for wavelengths of interest, that is, in the range of approximately 900 nm to approximately one micrometer.

Unlu et al. report in an article entitled "Resonant cavity enhanced AlGaAs/GaAs heterojunction phototransistors with an intermediate InGaAs Layer in the collector," Appl. Phys. Lett. 57 (8), Aug. 20, 1990, pg. 750-752, a device containing a photosensitive layer that is nearly lattice matched to a GaAs substrate of the device. As a result, the photosensitive layer is substantially unstrained. The device operates at approximately 900 nm, a wavelength in the absorption band of highly doped GaAs substrates, by incorporating a bulk layer of $In_{0.05}Ga_{0.95}As$ grown on top of a distributed Bragg reflector (DBR), thus providing a strongly asymmetric microresonator. However, the photosensitivity of the GaAs-based HPT cannot be extended substantially beyond 900 nm, because of the low In mole fraction in the InGaAs photo absorbing layers. Also, in this device there is no apparent mechanism to incorporate a highly strained layer.

In an article entitled "Surface-Emitting, Multiple Quantum Well GaAs/AlGaAs Laser with Wavelength-Resonant Periodic Gain Medium" by M. Y. A. Raja et al., Appl. Phys. Lett. Vol. 53, No. 18, Oct. 31, 1988, pg. 1679-1680, there is described Resonant Periodic Gain (RPG). RPG is employed to optimize the extraction of radiation from a vertical-cavity surface-emitting laser structure. To achieve RPG, GaAs quantum wells (QWs) are placed at the anti-nodes of a standing wave field set up by a microresonator.

It is thus an object of the invention to enhance the sensitivity of a photodetector which previously has low or minimal sensitivity to certain wavelengths of interest. This object is achieved by incorporating into the photodetector a resonant cavity having resonant cavity enhancement and Resonant Periodic Absorption between two reflectors.

Another object of the invention is to employ Resonant Periodic Absorption to increase photosensitivity of the photodetector. This object is realized by placing radiation absorbing regions of the photodetector at the antinodes of the standing waves of the light within the resonant cavity. An advantage of this feature is that the photodetector is sensitive at wavelengths greater than the absorption edge of the substrate of the device.

It is yet another object of this invention to provide a photodetector having two reflectors, which may be Distributed Bragg reflectors (DBR), i.e., mirror stacks which form a microresonator for enhancing radiation absorption efficiency, wherein the reflectors are on either end of a resonant cavity. An advantage of this structure is that the photodetector is either sensitive to a specific wavelength range, or attenuates other wavelengths outside of the range of interest.

Another object of the invention is to provide a detector for laser emissions having wavelengths greater than 900 nm, capable of passing through the substrate of the photodetector, such as GaAs, without significant attenuation. This object is achieved by incorporating a highly strained-layer within a photodetector at the antinodes of the standing lights waves set up in the resonant cavity of the photodetector. An advantage of this feature is that the performance of the photodetector is maintained at acceptable levels.

SUMMARY OF THE INVENTION

The foregoing and other problems are overcome and the objects of the invention are realized by a photodetector that is responsive to a wavelength or wavelengths of interest. The photodetector includes a resonant cavity structure bounded by first and second reflectors, the resonant cavity structure being resonant at the wavelength or wavelengths of interest for containing a plurality of standing waves therein. The photodetector further includes a radiation absorbing region disposed within the resonant cavity structure, the radiation absorbing region including a bulk layer or a plurality of quantum wells spaced apart from one another by a distance substantially equal to a distance between antinodes of adjacent ones of the standing waves. Each of the absorbing layers is spatially positioned at a location of one of the antinodes of one of the standing waves such that radiation absorption by each of the absorbing layers is enhanced. Through the use of resonant periodic absorption there is achieved a high optical gain with thin absorbing layers.

Resonant periodic absorption is demonstrated with an asymmetric microresonator structure that may include a strained-layer InGaAs/GaAs heterojunction phototransistor (HPT) interposed between two reflectors, such as Distributed Bragg reflectors. In accordance with the invention, optical intensity maxima of the microresonator are spatially aligned with radiation absorptive layers of the phototransistor, thus providing a significant enhancement in optical absorption. The phototransistor is suitable for optoelectronic interconnect, optical-logic device, neural network, and lightwave communication applications.

The quantum wells may include a plurality of layers, each of which may be comprised of strained or unstrained layers. Individual ones of the layers are spaced apart from one another by a spacer layer.

BRIEF DESCRIPTION OF THE DRAWING

The above set forth and other features of the invention are made more apparent in the ensuing Detailed Description of the Invention when read in conjunction with the attached Drawing, wherein:

FIG. 9 is a graph showing collector current versus collector-emitter voltage as a function of incident light power.

DETAILED DESCRIPTION OF THE INVENTION

Figure 1:
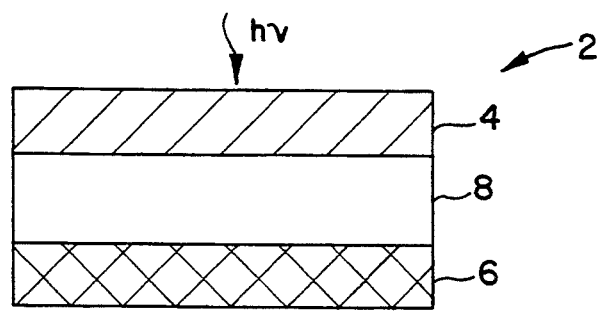
FIG. 1 is a cross-sectional view, not to scale, showing the basic components of the invention.

As shown in FIG. 1, the fundamental invention is a photodetector 2 having two reflector means 4, 6 on either side of a semiconductor resonant cavity 8 wherein the structure of the reflector means 4, 6 and the resonant cavity 8 actually enhance the absorption of light, resulting in increased efficiency of the photodetector 2.

Reflector means 4, 6 may be constructed from layers of insulators such as TiO$_2$ or SiO$_2$, metals such as Au, Ag, or InTiO, and semiconductors such as AlAs or GaAs, singularly or as permutations of the above, having either single or multiple interfaces between the layers or between the layers and air. The reflector means 4, 6 positioned on either side of the resonant cavity 8 need not be symmetric. Symmetry is a function of the number and type of layers and therefore affects the reflectance of the reflector means 4, 6. Therefore, the light absorption of the photodetector 2 will be affected by the materials and number of the layers making up the reflector means 4, 6. Note that although one embodiment of the invention comprises semiconductor distributed Bragg reflectors as the reflector means 4, 6, the reflectors need not be composed of semiconductors; e.g., dielectric materials such as SiO$_2$/TiO$_2$ may be employed. Indeed, an alternate embodiment of the invention, the reflectors 4, 6 may be formed after fabricating a heterojunction phototransistor by evaporating dielectric mirrors over end surfaces of the device.

A resonant light absorbing cavity 8 is positioned between the reflector means 4, 6 of the photodetector 2. The absorbing cavity 8 may be made from elemental or compound semiconductor materials; examples of the compound semiconductor materials are Type III/V, II/VI and IV/VI or be quaternary compound semiconductors. Examples of elemental semiconductors which can be used in the cavity include Si, Ge, C, In, Ga, P, As, Al, or Gray-tin (alpha-Sn). These semiconductors may be structured into a photodetector 2 as any one of the following: a PIN or a PN photodiode, an avalanche photodiode, a heterojunction phototransistor (HPT), a double heterojunction phototransistor, a bipolar heterojunction, or even a metal-semiconductor-metal structure which is light absorbing. The primary characteristic of the photoabsorbing region is, of course, that it has one or more light absorbing layers. These layers may be either bulk layers or quantum wells; and the layers may be unstrained, weakly-strained, or strained, as discussed below. There may be a single quantum well or several quantum wells with either strained or unstrained barrier layers between the quantum wells. In one particular embodiment of the invention more or less than three InGaAs quantum wells may be one group, but more or less than four groups may be employed. Also, it should be realized that the various layer thicknesses, doping concentrations and type, material compositions and type, and the like that are disclosed are not intended to be read in a limiting sense upon the practice of the invention.

Preferably, the photoabsorbing layers are positioned with respect to one another to achieve Resonant Periodic Absorption, which will be discussed in some detail. Even so, whenever a light absorbing layer is placed in a cavity, the phenomena of resonant cavity enhancement occurs. Thus, within certain embodiments of the photoabsorbing region, both resonant periodic absorption (RPA) and resonant cavity enhancement contribute to the efficiency of the photodetector. In the article by Raja et al., layers having gain are placed at the anti-nodes of the standing wave field in a laser structure to achieve resonant periodic gain, but in contradistinction, our invention comprises the placement of resonant periodic absorption layers at the anti-nodes of the standing wave field in a photodetector.

One teaching of the invention thus employs RPA in a photodetector, which may be an HPT, to achieve high absorbing efficiencies with thin absorbing layers, which may be InGaAs quantum wells, posited between two reflecting means, which may be distributed Bragg reflectors. A specific embodiment thus provides HPT devices with an optical gain greater than 600 for 930 nm incident light, assuming a responsivity of 0.3 A/W.

Figure 2:
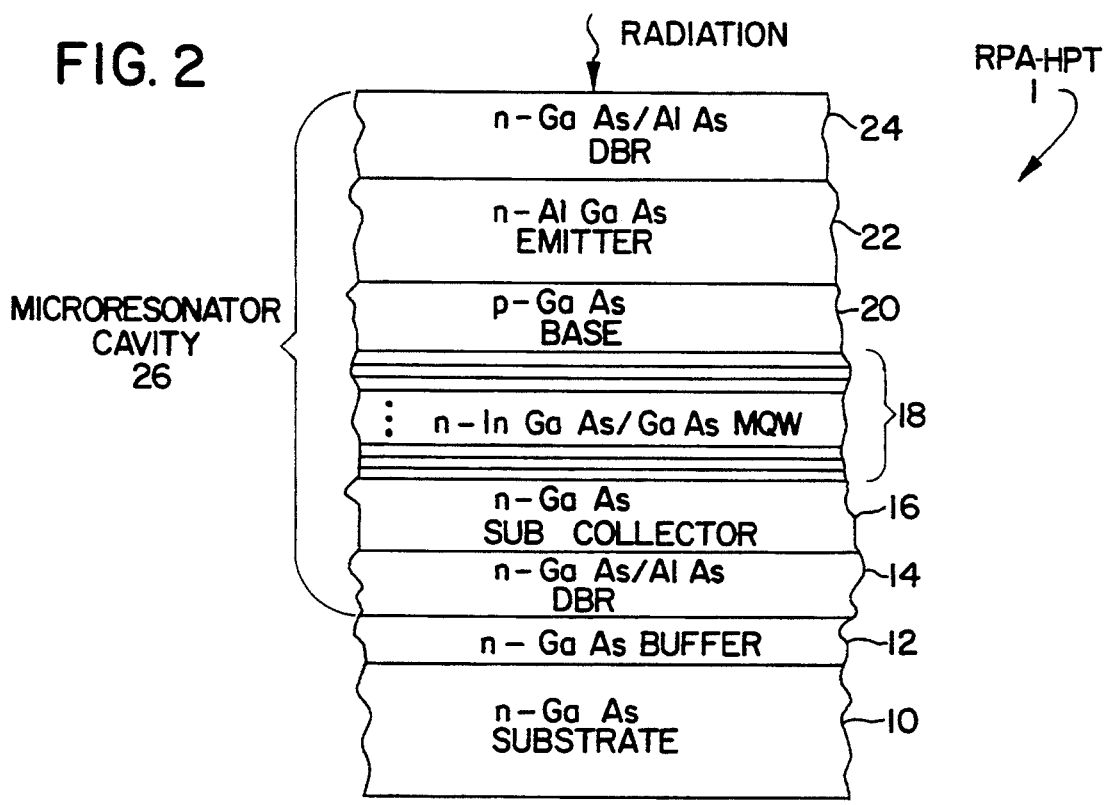
FIG. 2 is a cross-sectional view, not to scale, showing the strained layer InGaAs RPA-HPT of the invention.
Figure 3:
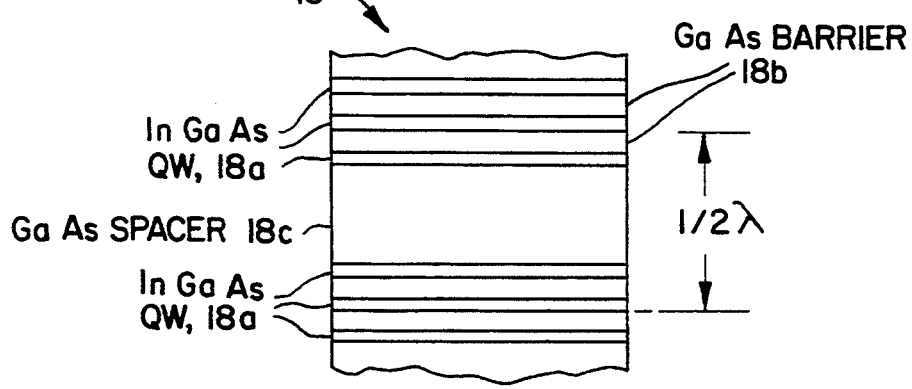
FIG. 3 is a cross-sectional view, not to scale, illustrating in greater detail a portion of the InGaAs multi-quantum well (MQW) collector region of FIG. 2.

FIGS. 2 and 3 illustrate one embodiment of the invention; wherein the photoabsorbing region comprises a high-gain resonant periodic absorption heterojunction phototransistor (HPT) 1 that is grown on a GaAs substrate 10 that is transparent at the wavelength or wavelengths of interest, although the substrate need not always be transparent. The illustrated device operates at 930 nm, and incorporates a strained-layer InGaAs/GaAs multiple quantum well (MQW) absorbing collector 18 region within an asymmetric Fabry-Perot microresonator cavity 26 defined by DBRs 14 and 24. The RPA-HPT 1 operates with resonant periodic absorption to enhance the phototransistor gain. Furthermore, spatially locating the absorbing layers at the peaks of the intensity of a standing-wave field existing within the asymmetric microresonator cavity 26 enhances the absorption, while minimizing the required amount of absorbing material in the structure. As will be made apparent below, the teaching of the invention thus provides a photodetector having a combination of resonant cavity enhancement and Resonant Periodic Absorption.

More particularly, and as is seen in FIG. 2, an epitaxially grown structure includes an n-GaAs buffer layer 12 disposed upon an n-GaAs substrate 10. Over the buffer layer 12 is formed an n-type GaAs/AlAs DBR 14 having a reflectance >0.99 comprised of a quarter-wave stack of alternating GaAs and AlAs layers. There is next formed an n-GaAs sub-collector 16, an n-InGaAs/GaAs multiple quantum-well (MQW) collector 18, a p-GaAs base 20, an n-$Al_{0.35}Ga_{0.65}As$ emitter 22, and a second n-type GaAs/AlAs DBR 24 with a reflectance of approximately 0.70. The DBRs (14, 24) define the asymmetric microresonator cavity 26. The lower reflectivity DBR 24 is the radiation receiving DBR.

The MQW collector 18 includes four groups of three 80 Å-wide $In_{0.12}Ga_{0.88}As$ quantum wells 18a separated by 100 Å-wide GaAs barriers 18b. In FIG. 3 only two of the four groups of QWs are illustrated. The four groups of three quantum wells 18a are arranged such that the center-to-center spacing between adjacent QW groups results in an optical thickness, i.e., the physical thickness multiplied by the index of refraction, between adjacent ones of the quantum well groups which is approximately equal to one half of the optical wavelength of interest.

In more detail and as an example only, the substrate 10 is comprised of GaAs(100) having a thickness of approximately 500 micrometers. The substrate 10 is doped with silicon at a concentration of approximately $2 \times 10^{18}$ $cm^{-3}$. The buffer layer 12 has a thickness of 2500 Å and is doped with silicon at a concentration of approximately $4 \times 10^{18}$ $cm^{-3}$. The DBR 14 is comprised of 15.5 periods of alternating AlAs and GaAs layers. Each of the GaAs layers has a thickness of 653 Å and is doped with silicon at a concentration of approximately $2 \times 10^{18}$ $cm^{-3}$. Each of the AlAs layers has a thickness of 785 Å and is doped with silicon at a concentration of approximately $1 \times 10^{18}$ $cm^{-3}$. The sub-collector 16 has a thickness of 250 Å and is also doped with silicon at a concentration of approximately $1 \times 10^{18}$ $cm^{-3}$. Each of the GaAs spacer layers 18b is doped with silicon at a concentration of approximately $1 \times 10^{16}$ $cm^{-3}$. The MQW collector 18 also includes a GaAs barrier layer that is interposed between the lower most group of quantum wells and the subcollector 16. This barrier layer has a thickness of approximately 850 Å and is doped with silicon at a concentration of approximately $1 \times 10^{16}$ $cm^{-3}$. Between the MQWs 18a and the base layer 20 is a collector layer comprised of GaAs having a thickness of 1100 Å, this layer being doped with Si at a concentration of approximately $1 \times 10^{16}$ $cm^{-3}$. The base layer 20 has a thickness of 2350 Å and is doped with Be at a concentration of approximately $1 \times 10^{18}$ $cm^{-3}$. The emitter layer 22 is $Al_{0.35}Ga_{0.65}As$ and has a thickness of 3000 Å. The emitter layer 22 is doped with silicon at a concentration of approximately $1 \times 10^{17}$ $cm^{-3}$. The lower reflectivity DBR 24 includes four periods of alternating AlAs and GaAs layers. The GaAs layers each have a thickness of 653 Å and are doped with silicon at a concentration of approximately $5 \times 10^{18}$ $cm^{-3}$. Each of the AlAs layers has a thickness of 785 Å and is doped with silicon at a concentration of approximately $3 \times 10^{18}$ $cm^{-3}$. If desired, a relatively thin (100 Å) GaAs cap layer may be provided over the top of the DBR 24 to protect the radiation receiving surface.

Figure 6:
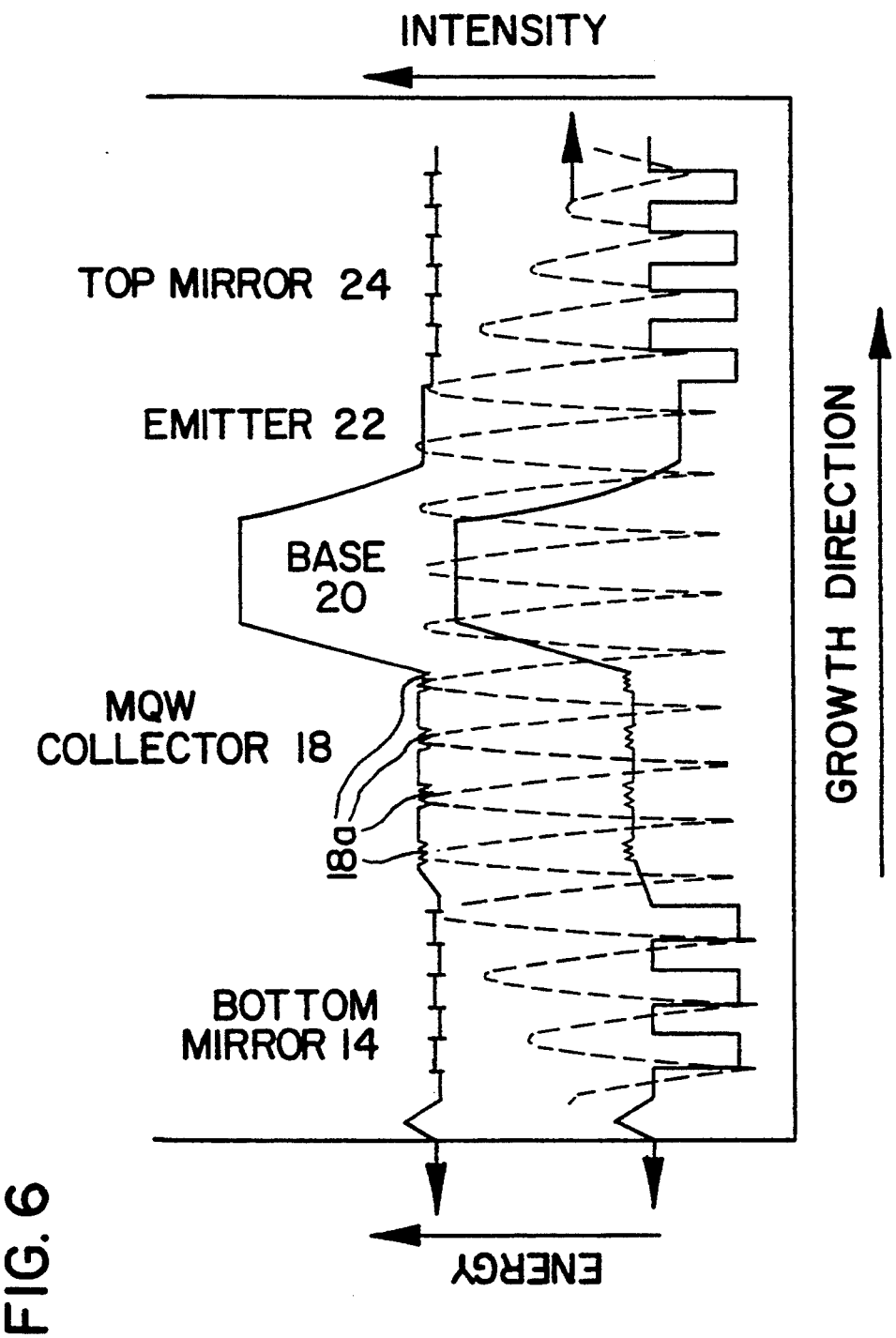
FIG. 6 illustrates a calculated energy band diagram and the corresponding optical intensity of one embodiment of the invention.

FIG. 6 illustrates a calculated energy band diagram and the corresponding optical intensity in the growth direction of the RPA-HPT 1. The GaAs spacer layers 18c position the InGaAs quantum wells 18a such that they are aligned to the maxima of the standing-wave optical field intensity. By positioning the quantum wells 18a near the field maxima, the radiation absorption in each quantum well 18a is optimized, and thus exploits the effect of the microresonator cavity 26. To optimize the absorption, the peak absorption wavelength of the InGaAs quantum wells 18a is matched with the microresonator cavity 26 resonance.

Figure 7:
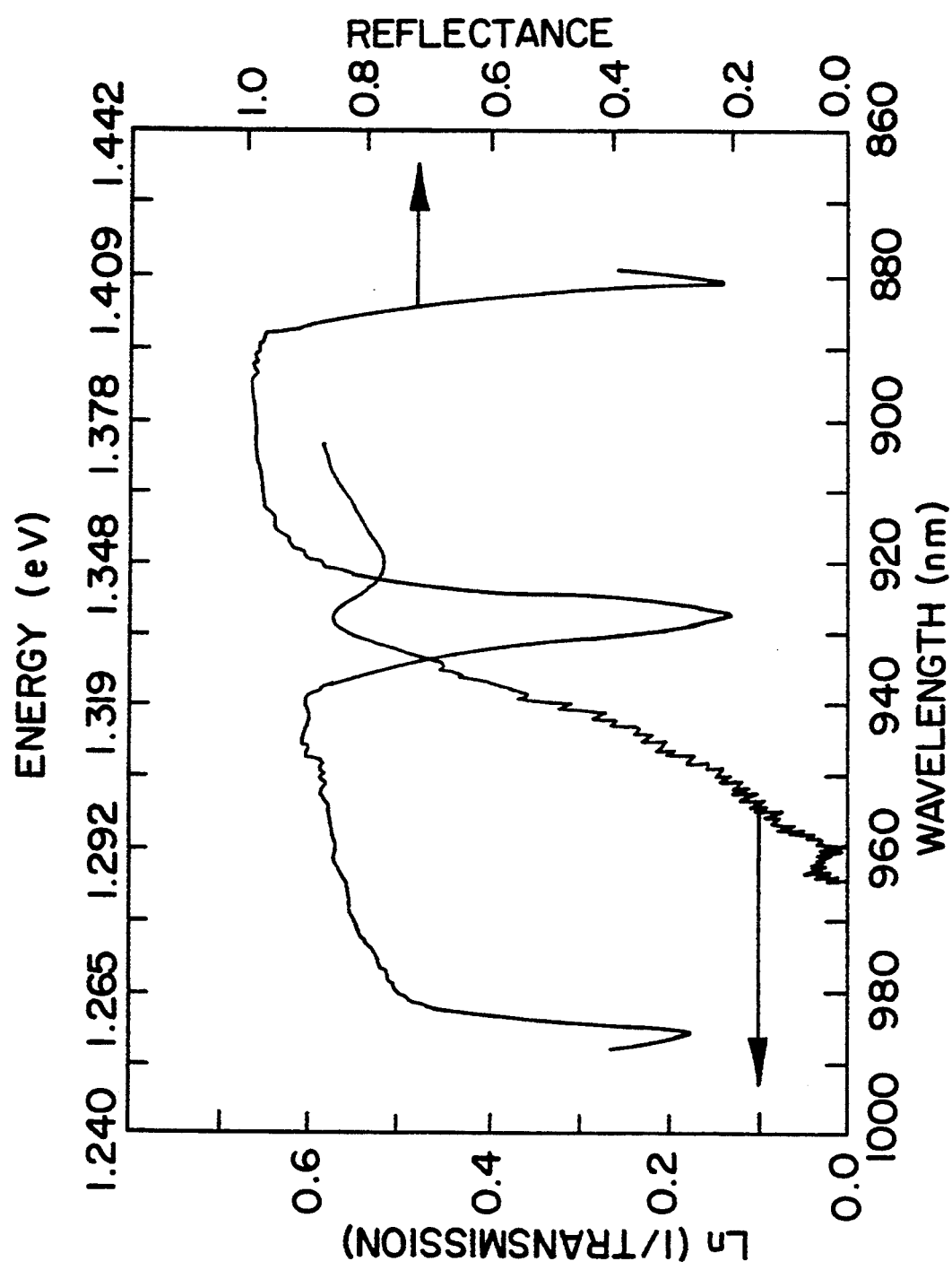
FIG. 7 is a graph wherein curve (i) illustrates Ln(1/Transmission), and curve (ii) illustrates a reflectance measurement of an embodiment of the invention.

FIG. 7 shows the measured room-temperature In(1/Transmission) of the strained layer InGaAs/GaAs quantum-well collector 18 without the DBRs 14 and 24, and the reflectance of the RPA-HPT 1 microresonator illustrating alignment of the excitonic absorption with the microresonator cavity 26 resonance.

Figure 4A:
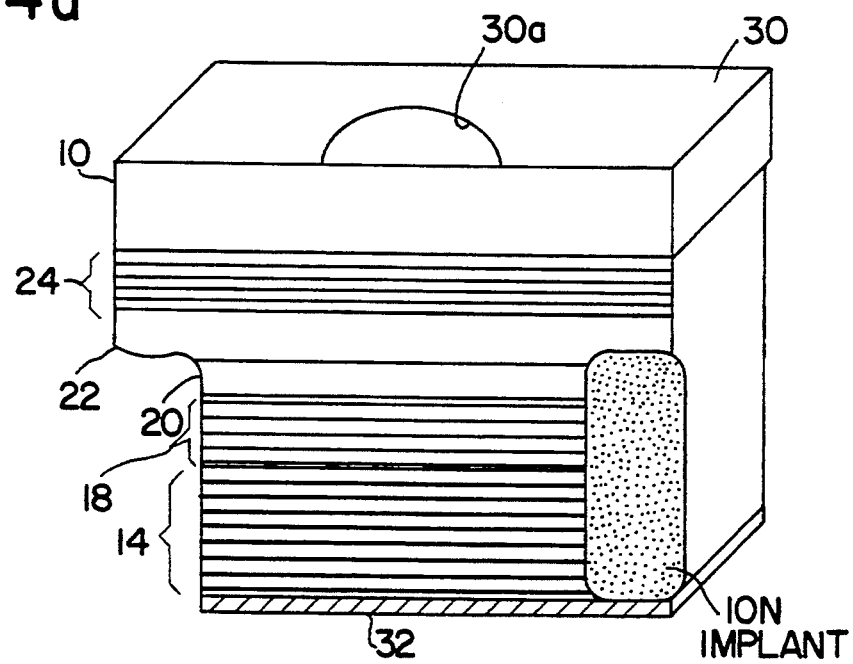
FIGS. 4a, 4b, 4c, and 5 each illustrate in cross-section, not to scale, an embodiment of the invention.
Figure 4B:
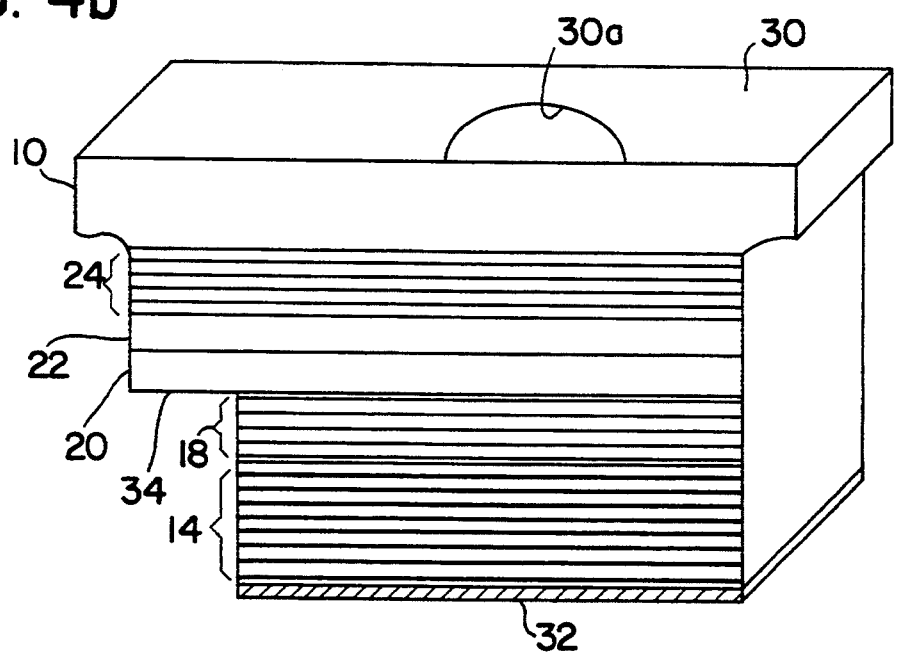

FIGS. 4a and 4b illustrate top views of two embodiments of the invention. In FIG. 4a radiation is received from the top surface through an aperture 30a made within an emitter contact 30. A portion of the device is etched away or is ion implanted to provide device isolation. A contact 32 is made to the bottom surface of the substrate 10. FIG. 4b shows a top illuminated three terminal device that is similar in construction to the device of FIG. 4a, with the exception of a base contact 34.

Figure 4C:
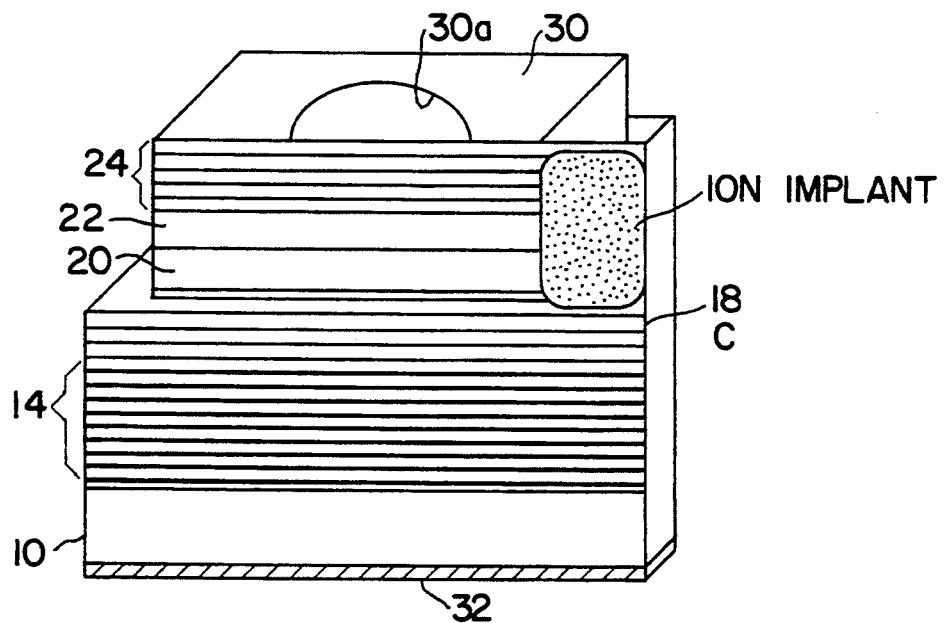
Figure 5:
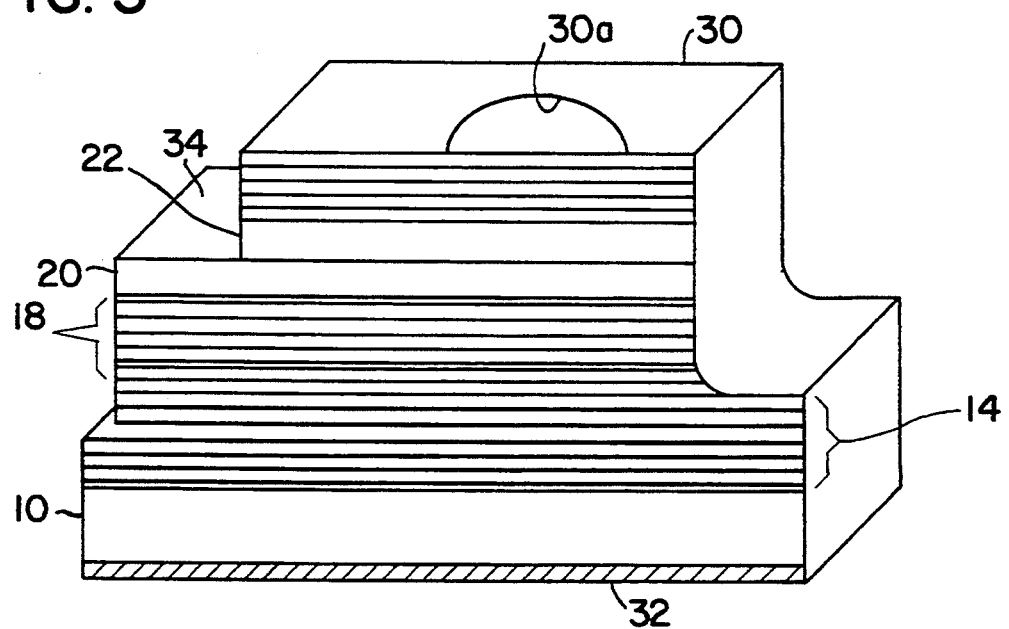

FIGS. 4c and 5 illustrate bottom views of two further embodiments of the invention, wherein the arrangement of layers is reversed from that shown in FIGS. 2, 4a, and 4b. For these embodiments the emitter contact 30 and the aperture 30a are provided on the bottom surface of the substrate 10. The lower reflectivity radiation receiving DBR 24 is provided adjacent to the substrate 10 and the high reflectivity DBR 14 is provided adjacent to the top contact 32. For each of these embodiments individual devices may be isolated by etching or ion implantation. These latter two embodiments illustrate the utility of the teaching of the invention in responding to radiation within the radiation pass band of the GaAs substrate 10.

Figure 8:
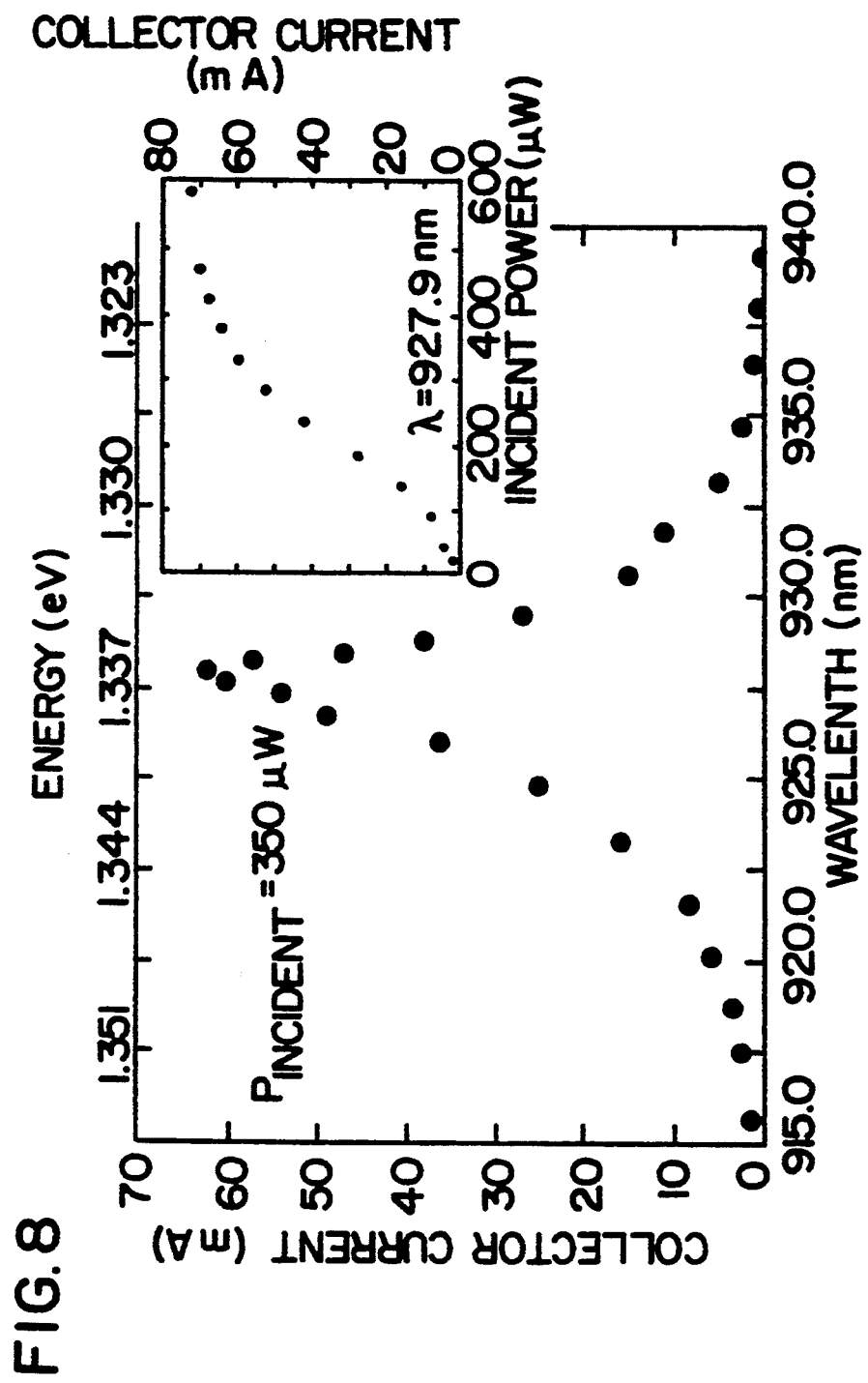
FIG. 8 is a graph illustrating collector current vs. wavelength (energy) of one embodiment of the invention.

The RPA-HPT 1 was fabricated using self-aligned photolithographic techniques to isolate individual RPA-HPT devices, and to form the n-type ohmic emitter contacts 30 having 25 micrometer diameter apertures 30a. The phototransistors were tested in a floating-base, common-emitter configuration with a tunable Ti:sapphire laser focused onto the emitter window to provide optical excitation. Optical gains exceeding 600 were obtained at 930 nm with a 4.0 volt bias potential and a collector current of 50 Ma. The photosensitivity of the RPA-HPT 1 versus wavelength correlates with the reflectivity versus wavelength of the microresonator 26, as shown in FIG. 8. In the inset of FIG. 8 there is plotted the collector current versus power at an exemplary wavelength of 927.9 nm.

FIG. 9 shows the collector current versus the common-emitter voltage as a function of several incident light powers, at an input wavelength equal to the cavity resonance. The RPA-HPT 1 was found to have a dark current of $I_{dark} < 1$ nA, and a break down voltage $V_{breakdown} = 8$ V.

In order to determine the strain-imposed limits on the thickness and composition of the InGaAs layers, a superlattice stability equation given by:

$$t_{crit}^{stable}(N,x,\Lambda) \leq 0.558\, a_o/Nx\, \ln(5.66N\Lambda/a_o), \quad (1)$$

is employed for N periods of a structure, each having a width $\Lambda$. The structure has a strained layer with a composition x and a thickness $t_{crit}$, and an unstrained layer with lattice parameter $a_o$. It should be noted that if each strained layer were itself a set of strained quantum-wells, with unstrained barriers 18b having widths $l_z$ and $l_b$, respectively, then x in this equation is replaced by the average composition, $$x_{ave} = l_z x_z / l_z + l_b, \quad (2)$$

where $x_z$ is the composition of the individual quantum wells. In the RPA-HPT 1 $\Lambda$ is equal to an optical half wave, i.e., $\lambda/2n$, where $\lambda$ is the wavelength of interest and where the average index of refraction is given by $n = \int n(z)dz/\int dz$ so as to achieve RPA.

Extrapolating to longer wavelength high-gain HPTs, there is employed a condition for metastability, $$t_{crit}^{metastable} = t_{crit}^{stable} + 3.75(\sigma_{exc}\Lambda/\mu x), \quad (3)$$

where $\mu$ is the shear modulus and $\sigma_{exc}$ is the excess stress. Based on a characterization of other strained InGaAs/GaAs devices, an excess strain of $\sigma_{exc}/\mu = 0.005$ is found to be allowed. Solving equation (3) for $l_z = 80$ Å and $l_b = 100$ Å, with strained InGaAs quantum wells, GaAs barriers, and a GaAs substrate:

$$t_{crit}^{metastable} = 440 \text{ Å } (3\ QWs/\text{period}).$$

For N=3 (an HPT optical gain of approximately 400), and then solving for the composition, x, and the operating wavelength, $\lambda$, For an $In_xGa_{1-x}As$/GaAs device, there is obtained x=0.268, and $\lambda = 1.05\ \mu m$.

It has thus been shown that RPA may be employed to extend the sensitivity of the InGaAs/GaAs HPT 1 to operate within the wavelength range of approximately 900 nm to approximately one micrometer.

In summary, the teaching of this embodiment of the invention places a HPT in the microresonator cavity 26, and employs resonant cavity enhancement and Resonant Periodic Absorption to overcome the before mentioned problem relating to the limitations placed on the composition and thickness of InGaAs radiation absorbing layers, because of the lattice mismatch of InGaAs and GaAs. There has been described a technique for producing high-gain GaAs-based heterojunction phototransistors whose sensitivity to wavelengths extends beyond 930 nm, and it has been shown that this technique can be used to extend the photosensitivity of GaAs-based HPTs to cover the range from approximately 900 nm to approximately one micrometer, a range which has heretofore been inaccessible due to excess strain within the photodetector device. As a result, the RPA-HPT 1 achieves high absorbing efficiencies with relatively thin (80 Å) highly strained InGaAs quantum wells. An exemplary embodiment demonstrates this technique by fabricating a device with an optical gain greater than 600 for 930 nm incident light.

One application for the RPA-HPT 1 is as a receiver in a monolithically integrated receiver/transmitter device, such as an optical logic device or an infrared (IR) radiation detector for use in fiber-optic communications. In that the RPA-HPT 1 operates within the radiation pass band of the GaAs substrate 10, the RPA-HPT 1 provides a receiver matched in wavelength to, for example, an InGaAs laser transmitter (not shown). RPA-HPT 1 may also serve as a receiver in an optoelectronic interconnect application for chip-to-chip or board-to-board communication. For example, a combination of vertically integrated RPA-HPTs and vertical-cavity surface-emitting laser (VCSEL) diodes, i.e., surface-emitting laser logic devices, operating at wavelengths in the transmission band of the GaAs substrate 10, provide for three dimensional interconnections.

Thus, while the invention has been particularly shown and described with respect to exemplary embodiments thereof, it will be understood by those skilled in the art that changes in form and details may be made therein without departing from the scope and spirit of the invention.

What is claimed is:

1. A photodetector responsive to a wavelength or wavelengths of interest, comprising:
    (a) a resonant cavity structure, said resonant cavity structure bounded by first and second reflector means, said resonant cavity structure being resonant at the wavelength or wavelengths of interest for containing a plurality of standing waves; and
    (b) a photodetector disposed within said resonant cavity structure, said photodetector having a radiation absorbing region comprising a plurality of quantum wells, said quantum wells spaced apart from one another by a distance substantially equal to a distance between antinodes of the standing waves, each of said quantum wells further being spatially positioned at a location of one of the antinodes of one of the standing waves such that radiation absorption is enhanced through resonant periodic absorption.

2. A photodetector as set forth in claim 1 wherein said first and said second reflector means are from a group consisting of metals, insulators, dielectrics, and semiconductors.

3. A photodetector as set forth in claim 2 wherein said first and said second reflector means are semiconductor distributed Bragg reflectors.

4. A photodetector as set forth in claim 3 wherein said distributed Bragg reflectors are asymmetric.

5. A photodetector as set forth in claim 1, wherein said photodetector is from a group consisting of PN photodiode, PIN photodiode, avalanche photodiode, heterojunction phototransistor, a double heterojunction phototransistor, a heterojunction bipolar transistor, and a MSM detector.

6. A photodetector as set forth in claim 1, wherein said radiation absorbing region comprises a plurality of groups of quantum wells and where there is more than one of said group, each one of said quantum wells within a group being spaced apart from one another by a spacer layer.

7. A photodetector as set forth in claim 6, wherein each of said quantum wells includes a plurality of layers, and said layers are strained.

8. A photodetector as set forth in claim 6, wherein each of said quantum wells includes a plurality of layers, and said layers are unstrained.

9. A photodetector as set forth in claim 6, wherein each of said quantum wells includes a plurality of layers each of which is comprised of strained InGaAs, individual ones of said strained InGaAs layers being spaced apart from one another by a GaAs barrier layer.

10. A photodetector-responsive to a wavelength or wavelengths of interest, comprising:
    (a) a resonant cavity structure, said resonant cavity structure bounded by first and second reflector means, said resonant cavity structure being resonant at the wavelength or wavelengths of interest for containing a plurality of standing waves; and
    (b) a radiation absorbing region disposed within said resonant cavity structure, said radiation absorbing region comprising one or more bulk layers, said bulk layers spaced apart from one another by a distance substantially equal to a distance between antinodes of the standing waves, each of said bulk layers further being spatially positioned at a location of one of the antinodes of one of the standing waves such that radiation absorption is enhanced through resonant periodic absorption.

11. A photodetector as set forth in claim 10, wherein said first and said second reflector means are from a group consisting of metals, insulators, dielectrics, and semiconductors.

12. A photodetector as set forth in claim 11, wherein said first and said second reflector means are semiconductor distributed Bragg reflectors.

13. A photodetector as set forth in claim 12, wherein said distributed Bragg reflectors are asymmetric.

14. A photodetector as set forth in claim 10, wherein said photodetector is from a group consisting of PN photodiode, PIN photodiode, avalanche photodiode, heterojunction phototransistor, a double heterojunction phototransistor, a heterojunction bipolar transistor, and a MSM detector.

15. A phototransistor, comprising:
    (a) a substrate;
    (b) a first reflector means disposed over said substrate;
    (c) a sub-collector layer disposed over said first reflector means, said sub-collector layer having a first type of electrical conductivity;
    (d) a radiation absorbing collector region disposed over said sub-collector layer, said radiation absorbing collector region including a plurality of quantum wells, said radiation absorbing collector region having said first type of electrical conductivity;
    (e) a base layer disposed over said radiation absorbing collector region, said base layer having a second type of electrical conductivity;
    (f) an emitter layer disposed over said base layer, said emitter layer having said first type of electrical conductivity; and
    (g) a second reflector means disposed over said emitter layer and forming, with said first reflector means, a resonant cavity structure bounded by first and second reflector means, said resonant cavity structure being resonant at a wavelength or wavelengths of interest for containing a plurality of standing waves; wherein each of said quantum wells are spaced apart from one another by a distance substantially equal to a distance between antinodes of adjacent ones of the standing waves, each of said plurality of quantum wells further being spatially positioned at a location of one of the antinodes of one of the standing waves such that radiation absorption is enhanced.

16. A phototransistor, comprising:
    (a) a substrate;
    (b) a first reflector means disposed over said substrate;
    (c) a sub-collector layer disposed over said first reflector means, said sub-collector layer having a first type of electrical conductivity;
    (d) a collector region disposed over said sub-collector layer, said collector region having said first type of electrical conductivity;
    (e) a radiation absorbing base layer disposed over said collector region, said radiation absorbing base layer including a plurality of quantum wells, said radiation absorbing base layer having a second type of electrical conductivity;
    (f) an emitter layer disposed over said base layer, said emitter layer having said first type of electrical conductivity; and
    (g) a second reflector means disposed over said emitter layer and forming, with said first reflector means, a resonant cavity structure bounded by first and second reflector means, said resonant cavity structure being resonant at a wavelength or wavelengths of interest for containing a plurality of standing waves; wherein each of said quantum wells are spaced apart from one another by a distance substantially equal to a distance between antinodes of adjacent ones of the standing waves, each of said plurality of quantum wells further being spatially positioned at a location of one of the antinodes of one of the standing waves such that radiation absorption is enhanced.

17. A phototransistor as set forth in claim 15, wherein said first type of electrical conductivity is n-type, and wherein said second type of electrical conductivity is p-type.

18. A phototransistor as set forth in claim 15, wherein said first type of electrical conductivity is p-type, and wherein said second type of electrical conductivity is n-type.

19. A phototransistor as set forth in claim 15, wherein each of said quantum wells is comprised of a group of quantum wells, individual ones of said groups being spaced apart from one another by a barrier layer.

20. A phototransistor as set forth in claim 15, wherein each of said quantum wells includes a plurality of layers each of which is comprised of InGaAs, individual ones of said InGaAs layers being spaced apart from one another by a GaAs barrier layer.

21. A phototransistor as set forth in claim 20, wherein each of said quantum wells is comprised of a plurality of layers of $In_{0.12}Ga_{0.88}As$, each of said layers being approximately 80 Å thick, and wherein individual ones of said plurality of layers are spaced apart from one another by a GaAs barrier layer having a thickness of approximately 100 Å.

22. A phototransistor as set forth in claim 15, wherein each of said reflector means is comprised of a distributed Bragg reflector.

23. A phototransistor as set forth in claim 15, wherein a plurality of said phototransistors are provided on said substrate.

24. A phototransistor as set forth in claim 15, wherein said wavelength or wavelengths of interest are within a range of wavelengths between approximately 900 nanometers and approximately one micrometer.

25. A phototransistor as set forth in claim 15, and further including an emitter contact disposed over said second reflector means, said emitter contact having an aperture made therein for admitting incident radiation into said resonant cavity structure.

26. A phototransistor, comprising:
   (a) a substrate;
   (b) a first reflector means disposed over said substrate;
   (c) an emitter layer disposed over said first reflector means, said emitter layer having said first type of electrical conductivity;
   (d) a base layer disposed over said emitter layer, said base layer having a second type of electrical conductivity;
   (e) a radiation absorbing collector region disposed over said base layer, said radiation absorbing collector region including a plurality of quantum wells, said radiation absorbing collector region having said first type of electrical conductivity;
   (f) a sub-collector layer disposed over said radiation absorbing collector region, said sub-collector layer having a first type of electrical conductivity;
   (g) a second reflector means disposed over said sub-collector layer and forming, with said first reflector means, a resonant cavity structure bounded by first and second reflector means, said resonant cavity structure being resonant at a wavelength or wavelengths of interest for containing a plurality of standing waves; wherein each of said quantum wells are spaced apart from one another by a distance substantially equal to a distance between antinodes of adjacent ones of the standing waves, each of said plurality of quantum wells further being spatially positioned at a location of one of the antinodes of one of the standing waves such that radiation absorption is enhanced.

27. A phototransistor as set forth in claim 26, wherein each of said quantum wells includes a plurality of layers each of which is comprised of InGaAs, individual ones of said InGaAs layers being spaced apart from one another by a GaAs barrier layer, and wherein said wavelength or wavelengths of interest are within a range of wavelengths between approximately 900 nm and approximately one micrometer.

28. A phototransistor as set forth in claim 26, wherein each of said quantum wells is comprised of a plurality of layers of $In_{0.12}Ga_{0.88}As$, each of said layers being approximately 80 Å thick, and wherein individual ones of said plurality of layers are spaced apart from one another by a GaAs barrier layer having a thickness of approximately 100 Å.

29. A phototransistor as set forth in claim 26, and further including an emitter contact disposed over a bottom surface of said substrate, said emitter contact having an aperture made therein for admitting incident radiation into said resonant cavity structure.

* * * * *